United States Patent
Troyer

(10) Patent No.: US 11,569,653 B2
(45) Date of Patent: Jan. 31, 2023

(54) ELECTRONIC FUSE FOR A POWER SUPPLY

(71) Applicant: Siemens Aktiengesellschaft, Munich (DE)

(72) Inventor: Markus Troyer, Neulengbach (AT)

(73) Assignee: Siemens Aktiengesellschaft, Munich (DE)

( * ) Notice: Subject to any disclaimer, the term of this patent is extended or adjusted under 35 U.S.C. 154(b) by 273 days.

(21) Appl. No.: 16/891,618

(22) Filed: Jun. 3, 2020

(65) Prior Publication Data
US 2020/0389009 A1 Dec. 10, 2020

(30) Foreign Application Priority Data

Jun. 5, 2019 (EP) ..................................... 19178439

(51) Int. Cl.
*G01R 1/20* (2006.01)
*H02H 3/087* (2006.01)
(Continued)

(52) U.S. Cl.
CPC .............. *H02H 3/087* (2013.01); *G01R 1/203* (2013.01); *G01R 15/202* (2013.01);
(Continued)

(58) Field of Classification Search
CPC .......... H02H 3/087; H02H 9/025; H02H 9/04; H02H 7/20; G01R 1/203; G01R 15/202
See application file for complete search history.

(56) References Cited

U.S. PATENT DOCUMENTS

| | | | |
|---|---|---|---|
| 6,031,745 A * | 2/2000 | Southman ............. | H02M 7/217 363/126 |
| 2011/0025400 A1 * | 2/2011 | Rogne ................. | H02J 7/00309 327/478 |

(Continued)

FOREIGN PATENT DOCUMENTS

| CN | 109830947 | 5/2019 |
|---|---|---|
| EP | 1236257 | 9/2002 |

(Continued)

OTHER PUBLICATIONS

EP Search Report dated Dec. 3, 2019 based on EP19178439 filed Jun. 5, 2019.

*Primary Examiner* — Dominic E Hawkins
(74) *Attorney, Agent, or Firm* — Cozen O'Connor

(57) ABSTRACT

An electronic fuse for a power supply includes at least two switching elements and a regulation unit, wherein a first switching element is arranged in a main branch, where the regulation unit is switches off the first switching element when a predetermined threshold value is exceeded by a prevailing current value, and a second switching element that is also actuated by the regulation unit, which is arranged in an auxiliary branch parallel to the first switching element and assumes a substantial proportion of a resulting power loss when an overload occurs, and the second switching element, which is arranged in at least one auxiliary branch, is configured or optimized for linear operation, and where the at least two switching elements are configured such that the line resistance of the second switching element is at least twice the line resistance of the first switching element.

13 Claims, 3 Drawing Sheets

(51) Int. Cl.
G01R 15/20 (2006.01)
G01R 19/165 (2006.01)
G05F 1/573 (2006.01)
H03K 3/0233 (2006.01)

(52) U.S. Cl.
CPC ..... *G01R 15/205* (2013.01); *G01R 19/16528* (2013.01); *G05F 1/573* (2013.01); *H03K 3/02337* (2013.01)

(56) References Cited

U.S. PATENT DOCUMENTS

2015/0115916 A1* 4/2015 Schweigert ......... H02M 3/1584
323/272
2018/0278039 A1* 9/2018 Reddy Kambham .... H02H 1/06

FOREIGN PATENT DOCUMENTS

| WO | 02082611 | 10/2002 |
|----|----------|---------|
| WO | 2011018113 | 2/2011 |

\* cited by examiner

ELECTRONIC FUSE FOR A POWER SUPPLY

BACKGROUND OF THE INVENTION

1. Field of the Invention

The present invention relates generally to the field of electrical engineering, in particular to the field of power electronics and power electronics circuits and, more particularly, to an electronic fuse for a power supply comprising at least two switching elements and a regulation unit, where a first switching element is arranged in a main branch via which a supply voltage of the power supply is conducted to at least one output or load such that when a predetermined threshold value is exceeded by a prevailing current value, the regulation unit switches the first switching element, and where an at least second switching element, which is likewise actuated by the regulation unit, is provided in an auxiliary branch parallel to the first switching element and assumes a substantial proportion of a resulting power loss in the event of an overload.

2. Description of the Related Art

Nowadays, in a multiplicity of devices, especially between a voltage supply and/or power supply and an electrical load, electronic fuses are used as protective devices. Particular in industrial direct-current distribution installations, electronic fuses or monitoring devices are now outclassing classic circuit breakers or fuses because current limitations in overload and/or high-resistance lines represent a great challenge for classic protection devices such as circuit breakers or fuses and ever greater demands on installation safety require an increasing amount of protection and steadily increasing selectivity conditions.

Thermally or magnetically actuated protective elements, such as fuses or circuit breakers, require a multiple of the design current in order to trip, for example. As a result, it is possible that cable diameters to be dimensioned must, for example, be made significantly larger than would be assumed from the current-carrying capacity. Furthermore, current limitations can have an effect on switching power supplies or switched-mode power supplies, of which in some circumstances the current is kept constant in the event of an overload and/or short circuit, thus delaying the triggering of the thermally actuated protective element. In addition, the relatively high design current of thermally (or also magnetically) triggering protection elements can lead to, for example, clocked power supplies reacting with a reduction in the output voltage, in order to be able to provide a fault current and limit the output current in this way. The reduction in the output voltage or this voltage dip can, for example, involuntarily cause reactions in the load or the further consumers (for example, switching off sensitive devices or programmable controllers).

Electronic monitoring devices can be designed or adjusted, for example, with greater selectivity and substantially more precisely for such circumstances to initiate countermeasures, such as in the event of an overload and/or short circuit, and also to permit overcurrent limitation. However, sensitive monitoring devices are of only limited practical use as they can react, for example, even in the case of small load fluctuations and possibly shut down an entire installation.

An electronic fuse must therefore permit a desired or necessary measure of robustness and, if necessary (for example, in the event of a short circuit or overload), a current flow into the load or component protected in this way (for example, control, programmable logic circuit or processor) must be interrupted safely and quickly. This means that nowadays, on the one hand, linear limiting circuits are frequently used to limit overcurrents that occur (for example, when a capacitive load or a load with a capacitive component is connected) to a mostly predefinable value and, on the other hand, circuits that can quickly and reliably interrupt the current flow when an adjustable threshold value is exceeded. The load and associated supply lines are thereby protected from damage or destruction. Electronic fuses of this type mostly comprise at least one switching element, usually a semiconductor-based switch, via which the circuit is interrupted.

In the case of electrical loads with a capacitive component or capacitive loads, inrush currents can be caused by the capacitive component when this load is operationally switched on or connected to a voltage and/or current source (usually a DC voltage source). The capacitive components of the load or a capacitive load in this case represent an ideal capacitor which, when a voltage jump is applied, such as when connecting to the voltage supply, results in a current pulse that is theoretically infinite in accordance with the relationship $i_c(t)=C*dU/dt$ or can represent an ideal short circuit at the moment of switch-on.

In practice, such current pulses are limited, for example, at least by the parasitic, ohmic components of the lines, ohmic components of the switching element, an equivalent series resistance (ESR) in which the ohmic conduction losses and the dielectric reversal losses of the capacitor are combined, etc. However, such inrush currents can still achieve values via which, for example, damage to the switching element or the circuit can occur, for example, primarily as a result of thermal stress, or in which an optional additional protective device (for example, safety fuse) of the electronic fuse is unintentionally caused to trip. In order to prevent damage to the switching element or the circuit when connecting in particular a load with a capacitive component, it is necessary to limit the inrush currents accordingly, i.e., the inrush currents are limited, for example, by appropriate switching of the switching element to a value that poses no risk to the switching element and/or the circuit.

For this purpose, the switching element is connected, for example, such that it is used, for example, as a controlled current source, i.e., when a transistor (for example, metal oxide field-effect transistor or MOS-FET) is used as a switching element, the transistor is operated in "linear operation". In linear operation, the transistor, in particular the MOS-FET, is neither completely blocked nor completely switched through. The transistor is located in the "saturation" or "constriction region", in which a voltage increase between a "drain contact" and a "source contact" of the transistor has little increasing effect on a current (the "drain current") flowing between these contacts.

As a result of the corresponding wiring or operation of the switching element in linear operation, for example, the voltage jump when the load is connected is converted into a constant current via which the capacitive load component is charged until an operational output or load current is established or the current is limited to the load. Linear regulators are used, for example, as corresponding limiting circuitry for limiting overcurrents that occur to a predetermined value. Such an electronic fuse or monitoring unit for power supplies is known, for example, from publication EP 1 236 257 B1. The circuit concept shown in the publication EP 1 236 257 B1 is based on dividing an output of a power supply over several channels and, in the event of a fault (for example, short circuit, overload), switching off the corresponding channel without the error affecting other channels or the entire supply system, for example, in the form of voltage drops. For this purpose, each channel is equipped and monitored with a switching element, in particular a transistor. However, a selection and design of the switching element, in particular for current limitation or linear operation, represents a great challenge. In particular, when a capacitive load or a load with a capacitive component is connected, for example, the entire supply voltage on the switching element can drop in the first connection moment, as a result of which a very high or maximum power loss occurs at the switching element, which can lead to thermal load or damage to the switching element. In order to prevent destruction of the switching element, switching elements with relatively large chip surfaces must be used, for example, which can lead to high costs.

A power supply with switch-off protection is therefore disclosed in publication WO 02/082611 A2, in which the inrush currents are distributed to parallel branches and thus the power loss to two switching elements, i.e., to a main switching element in a main branch and an auxiliary switching element in an auxiliary branch. Here, the main switching element is opened in the main branch via a regulator unit by a corresponding signal when an adjustable threshold value of the current is exceeded. In normal operation, the main switching element is conductive, i.e., the main switching element is operated in the ohmic or linear range. As soon as a limitation of the current to a mostly predefinable value is necessary (for example, in the event of an overload, in the event of a short circuit), the current commutates into the auxiliary branch, from which the current supply and a substantial proportion of the resulting power loss are taken over. Here, in addition to the auxiliary switching element, the auxiliary branch has an additional power resistor for current limitation. In order, for example, to achieve a thermally favorable load distribution, the actuation of the switching elements must be designed accordingly, and the circuit thus has a relatively elaborate and complex circuit topology. Furthermore, the circuit disclosed in the publication WO 02/082611 A2 has the disadvantage that it can only be produced in a limited or partially automated manner as in particular, the size required due to the additional power resistor often requires a manual assembly of a printed circuit board when creating the circuit.

SUMMARY OF THE INVENTION

In view of the foregoing, it is therefore an object of the invention to provide an electronic fuse for a power supply that can be produced in a simple, automated and cost-effective manner and that enables simple adaptation to limitation specifications and rapid and reliable tripping in the event of a fault.

These and other objects and advantages are achieved in accordance with the invention by an electronic fuse that comprises at least two switching elements and a regulation unit. The first switching element is arranged in a main branch via which a supply voltage of the power supply is conducted to at least one output or a load. If a predetermined threshold value is exceeded by a prevailing current value, then the regulation unit switches the first switching element or to substantially reduce a current flow via the first switching element. An at least second switching element, which is likewise actuated by the regulation unit and is arranged in an auxiliary branch, is arranged parallel to the first switching element and assumes a substantial proportion of a power loss that occurs in the event of an overload. The first switching element and the at least second switching element are produced using different technology and the at least second switching element is configured or optimized for linear operation. Furthermore, the at least two switching elements are configured such that the line resistance of the second switching element has at least has twice the amount of line resistance of the first switching element.

The main aspect of the electronic fuse in accordance with the invention consists, in particular, in that, for normal operation, i.e. in the case of conduction, of the fuse and for overload or in a limiting operation (i.e., the prevailing current is limited to the predetermined threshold value), at least two parallel switching elements of different manufacturing technology or construction technology and with different line resistances are used. In particular, due to the different line resistances of the at least two switching elements, an asymmetrical current distribution is achieved without great structural complexity and without great costs. The power losses occurring can be divided in such a way that, in particular in the auxiliary branch, an additional power resistor for limiting the current can be dispensed with or its resistance value can be kept very low. Due to the line resistance of the second switching element being of at least twice the magnitude, in the case of a limitation a majority of the power loss is absorbed by the at least second switching element or the at least one auxiliary branch. In the case of conduction or in normal operation, the at least second switching element or the auxiliary branch is relieved of the main branch with the first switching element to such an extent that the at least second switching element can cool down. By using switching elements in which an amount of the line resistance of the at least first switching element is at least half as great as the amount of the line resistance of the second switching element, thermally favorable loss distribution is achieved in a simple and cost-effective manner, without complex circuit topology and/or complicated actuation. Furthermore, the electronic fuse according to the invention can be produced very simply in an automated manner.

Furthermore, it is advantageous if the regulation unit of the electronic fuse is configured in such a way that, after an overload, i.e., when the prevailing current value falls below the predetermined threshold value or setpoint value again and begins to decrease against an operating current value of normal operation, the first switching element, which is arranged in the main branch, is switched on again. In the main branch, the current increases again, for example, once a threshold voltage of the first switching element is reached. In the parallel auxiliary branch and thus in the at least second switching element, the current decreases proportionally, as a result of which the at least second switching element is relieved. As a result, the power loss that arises in the event of short-term overload cases (for example, connecting a capacitive load) can be overcome without damage by the second switching element, at least for a limited time.

Ideally, the regulation unit is set up such that, in the event of tripping (i.e., in the event of a short circuit or prolonged overload), the at least two switching elements are switched off (possibly with a time delay). This prevents the switching elements and a load protected by the fuse from being damaged by high currents and/or overvoltages in a simple manner.

It is furthermore advantageous if the at least second switching element has a higher voltage limit than the first switching element. A voltage value is considered as a voltage limit or "voltage breakdown" limit, which voltage value can lead to breakdowns and thus to failure of the switching element if it is exceeded by an electric field inside the switching element. The at least second switching element, which is arranged in the auxiliary branch and is operated for current limitation in linear operation in the event of an overload, must ideally be able to withstand a higher voltage than the first switching element arranged in the main branch, which is switched off by the prevailing current when the threshold value is exceeded. A further important parameter for the switching elements is the "Safe Operating Area". This represents a diagram specified by the manufacturer, in which a safe operating area of the respective switching element is indicated graphically. From this diagram, for example, a maximum current can be read via the switching element (for example, drain current in a MOS-FET) at a corresponding, applied voltage (for example, drain source voltage in a MOS-FET) at which reliable operation can be guaranteed.

In a preferred embodiment of the electronic fuse in accordance with the invention, the first switching element comprises a field-effect transistor (FET). In this case, for example, a Trench FET can be used, which is optimized for switching operation. Trench FETs have been developed in particular in order to reduce line losses in switching operation. They therefore ideally have a relatively low line resistance (for example, 5 mOhm or less). In normal operation, it is very easy to force a current flow into the main branch or via the first switching element. Furthermore, in the case of a trench FET optimized for switching operation, for example when switching on the switching element (i.e. change from the blocking region to the conductive or ohmic region of the transistor), the characteristic curve region of linear operation is traversed relatively quickly. In other words, transistors that are optimized for switching operation usually have a relatively steep output characteristic so that, for example, when switching on, the ohmic range is reached relatively quickly.

In a further expedient embodiment of the electronic fuse in accordance with the invention, the at least second switching element is designed as a planar field-effect transistor, as a trench field-effect transistor or as a bipolar transistor with insulated gate electrode (IGBT), where the at least second switching element is always optimized for linear operation. Due to their design, planar field-effect transistors have, for example, ideal properties for linear operation as they have a relatively large chip area and thus a corresponding thermal mass is available to absorb and finally dissipate the power loss. Furthermore, there are also Trench FETs optimized for linear operation that can be used as a second switching element in the auxiliary branch. Alternatively, for example, an IGBT can also be used as a second switching element, which has advantages such as good transmission behavior, high blocking voltage and almost powerless actuation.

For measurement of the prevailing current value, it may be expedient if at least one current measuring resistor, a "shunt", is provided, which is arranged in series with a connection point of the at least two switching elements arranged in parallel. When switching elements of the FET type are used, the current measuring resistor is arranged, for example, in series with the connection point through which the two source terminals of the FETs are connected. Here, a prevailing total current is measured by the current measuring resistor or shunt, which prevailing overall current is divided into a main branch and auxiliary branch. The current measuring resistor or shunt is a low-resistance electrical measuring resistor that is used to measure a current value. The current through which the shunt is currently flowing causes a voltage drop proportional to its value, which is measured.

Alternatively, it may also be expedient if a current measuring resistor or shunt is arranged in series for the measurement of the prevailing current value for each of the at least two switching elements. In other words, a shunt is provided in each branch or each switching element, from which the respectively prevailing current value in the respective branch, i.e., main branch and auxiliary branch, is determined. The respective current measuring resistors are ideally established to be low-impedance or not too high-impedance so as not to influence the current distribution into the branch as far as possible due to the different line resistances of the switching element. For actuating the switching element, a total current value, such as in the regulation unit, can be calculated from the current values determined in the branches. By dividing the current measurement into the respective branches, the electronic fuse in accordance with disclosed embodiments of the invention can be adapted very easily, for example, to different power supplies with a different supply voltage (for example, 24 V DC voltage or 48 V DC voltage).

The use of a Hall effect sensor or a magnetoresistive sensor constitutes a further advantageous method for measuring the prevailing current value. Here, the measurement of the prevailing current value can be galvanically isolated, such as in series with the connection point of the at least two switching elements arranged in parallel or, for example, in the respective branches of the switching element.

In a preferred embodiment of the electronic fuse in accordance with the invention, the regulation unit comprises at least one first regulator for actuating the first switching element and one second regulator for actuating the at least second switching element, where a current measurement for the respective branch can also be performed separately. As a result, the main and auxiliary branch or the respective switching elements can be each actuated or regulated separately in a simple manner using a regulator, if appropriate with separate current measurement. The first regulator actuates the first switching element via a driver unit, such as during normal or line operation, such that a predetermined output voltage is applied to the load. The second regulator likewise actuates the second switching element via a driver unit, in the event that the current is to be limited, such as in the event of an overload when starting up a capacitive load or in the event of a load jump. Here, it is advantageous if the regulation unit is constructed from analog regulator units to enable rapid regulation and actuation of the switching elements. For this purpose, operational amplifier circuits are used, for example.

Alternatively, the regulation unit can comprise a cascade of analog and digital regulator units. For example, tasks can be assumed by the digital regulator units, which tasks are to be performed slowly and accurately. Thus, for example, the most precise regulation possible to the predetermined threshold value of the current can be assumed by a digital regulator unit that has its own current measurement, for example. In this way, for example, temperature drift and offset deviations of the analog regulator units can be compensated by tracking the threshold value for the analog regulator units. The digital regulator units can be formed, for example, as a microcontroller or as a programmable integrated circuit (for example, a Field Programmable Gate Array (FPGA)). Rapidly reacting analog regulator units (e.g., operational amplifier circuits) are then used for regulation and actuation of the switching elements in the respective branches (main and auxiliary branch).

In a further alternative embodiment, the regulation unit comprises digital regulator units, where sufficiently fast digital regulator units (for example, microcontrollers, FPGAs) must be used in particular for regulating and actuating the respective switching elements in the main and auxiliary branch.

Furthermore, it is favorable if a voltage supply of the regulation unit is isolated or galvanically isolated from the supply voltage of the power supply. That is, the regulation unit or the regulators that comprise the regulation unit are supplied with voltage, for example, via an auxiliary supply. In terms of potential, this auxiliary supply lies, for example, above the supply voltage (e.g., 24 V DC voltage) of the power supply to be able to actuate or switch the switching element correctly.

In an advantageous embodiment of the electronic fuse, a switching unit is also provided for switching the first switching element. The switching unit can be formed, for example, as a digital unit, in particular a microcontroller or programmable, integrated circuit (for example, Field Programmable Gate Array or FPGA) or as an analog comparator unit with hysteresis.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained hereinafter in an exemplary manner with reference to the accompanying figures, in which.

DETAILED DESCRIPTION OF THE EXEMPLARY EMBODIMENTS

Figure 1:
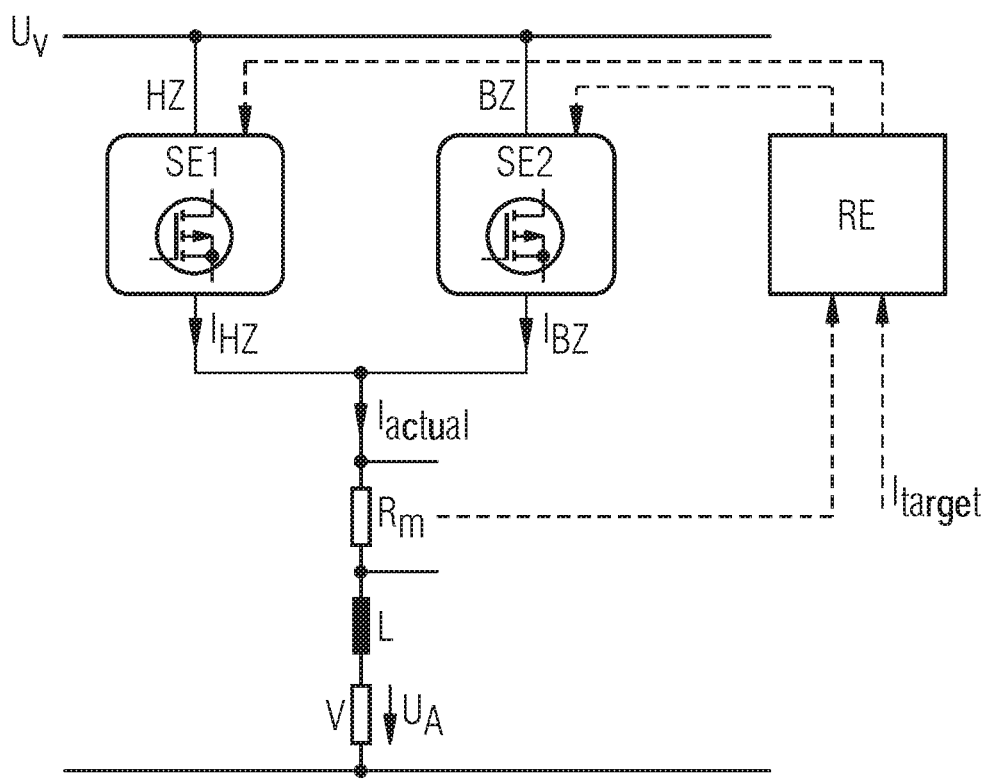
FIG. 1 shows a diagrammatic and exemplary configuration of the electronic fuse in accordance with the invention.

FIG. 1 shows an exemplary and diagrammatic view of an electronic fuse for a power supply with a supply voltage Uv (for example, 24 V DC voltage). The electronic fuse comprises at least one first switching element SE1 and at least one second switching element SE2, and a regulation unit RE for regulating and actuating the at least two switching elements SE1, SE2. The first switching element SE1 is arranged in a main branch HZ. The supply voltage Uv is conducted via the main branch HZ to at least one output of the power supply or to a load V, at which an output voltage UA then drops. A main branch stream $I_{HZ}$ flows through the main branch HZ. The load V can have capacitive components which, for example when the power supply is connected, can lead to inrush currents which briefly exceed a predetermined threshold value $I_{target}$ for the current and thus represent an overload for a short time.

A basic function of such an electronic fuse is to prevent an arbitrarily large current $I_{actual}$ from flowing through a branch of the circuit. A complete interruption of the power supply (for example, in the event of a short circuit, idling and persistent overload) still assumes an operating state in which the current $I_{actual}$ is limited to a predetermined threshold value $I_{target}$. This limiting operation is also used, for example, in the event of a short-term overload such as, for example, when a capacitive load is connected.

For this purpose, an auxiliary branch BZ is provided that is connected in parallel to the main branch HZ. The at least second switching element SE2 is arranged in the auxiliary branch BZ, through which a limiting current $I_{BZ}$ flows. The second switching element SE2 is thus arranged parallel to the first switching element SE1 in the main branch and, in the event of an overload or limiting operation, takes over a substantial proportion of the current $I_{actual}$ flowing in the circuit or a resulting power loss.

In the electronic fuse in accordance with the invention, the first switching element SE1 and the at least second switching element SE2 are manufactured using different technologies, where the second switching element SE2 is configured or optimized for linear operation (i.e., the second switching element SE2 is used, for example, as a controlled current source). Furthermore, the at least two switching elements SE1, SE2 are configured such that a line resistance of the at least second switching element SE2 has at least twice the amount of line resistance of the first switching element SE1. Ideally, the at least second switching element SE2 also has a higher rated voltage, in particular a higher Voltage Breakdown Limit, than the first switching element SE1.

Here, for example, a Trench FET can be used as the first switching element SE1 in the main branch HZ, which trench FET is optimized, for example, for a switching operation. Such a transistor has, for example, a relatively low line resistance (for example, 5 mOhm). In the auxiliary branch, a planar FET, which is set up for linear operation and has, for example, a line resistance value of approximately 50 mOhm, can be used as a second switching element SE2. Alternatively, Trench FETs or IGBTs which have been optimized for linear operation can also be used as a second switching element SE2. Due to the use of switching elements SE1, SE2 with different construction technology and different line resistances, a current distribution between the main branch HZ and auxiliary branch BZ is produced, keeping the power loss as low as possible during normal operation. For limiting operation, however, a transistor can be selected in the auxiliary branch as the second switching element SE2, which limits the prevailing current $I_{actual}$ in the event of an overload and can absorb a large part of the power loss, at least for a short time.

Moreover, the electronic fuse comprises at least one current measuring resistor $R_m$, from which a prevailing current value $I_{actual}$ is measured and forwarded to the regulation unit RE. For this purpose, the current measuring resistor $R_m$ is arranged, for example, in series with a connection point of the main branch HZ and of the auxiliary branch BZ.

Alternatively, the current measurement can also be performed with the aid of two current measuring resistors, where a first current measuring resistor is arranged in the main branch in series with the first switching element SE1 and a second current measuring resistor is arranged in the auxiliary branch in series with the second switching element SE2. Here, the current measuring resistor should be dimensioned such that a measurement with as little interference as possible and with corresponding amplification is possible, but influencing the current distribution and regulation by the regulation unit RE is kept as low as possible. In the case of a current measurement in the two branches HZ, BZ, the respective prevailing currents $I_{HZ}$, $I_{BZ}$ are then measured in the branches HZ, BZ, from which the entire prevailing current value $I_{actual}$ can then be determined.

Alternatively, the prevailing current value $I_{actual}$ can also be measured in a galvanically isolated manner via a Hall-effect sensor or via a magnetoresistive sensor. Alternatively, these sensors can also be arranged in the branches HZ, BZ in order, for example, to measure the currents $I_{HZ}$, $I_{BZ}$. The prevailing current value $I_{actual}$ is then determined as the sum of these currents $I_{HZ}$, $I_{BZ}$.

In addition, an inductance L can optionally be connected upstream of the load V, via which inductance L a maximum current increase and thus the entire dynamics of the circuit can be determined. Here, the current increase that can be predetermined by the inductance L is, for example, decisive for a configuration of the electronic fuse and can also determine, for example, the parameterization of the regulation unit RE or its components.

The regulation unit RE is provided for regulation and actuation of the switching elements SE1, SE2, and compares the predetermined threshold value $I_{target}$ for the current with the currently measured current value $I_{actual}$ in the circuit for actuation. The predetermined threshold value $I_{target}$ is higher than a maximum operating current $I_{b,max}$ to be expected in normal operation. The regulation unit RE is set up to switch off the first switching element SE1 when the predetermined threshold value $I_{target}$ is exceeded by the prevailing current value $I_{actual}$, i.e., in the event of extreme overload, such as short-circuiting or idling, but also in the event of short-term overload, such as by connecting an at least partial capacitive load V. If, for example, after an overload by connecting an at least partial capacitive load V, the prevailing current value $I_{actual}$ again fall short of the predetermined current value $I_{target}$, then the first switching element SE1 is switched on again via the regulation unit RE.

In addition, the regulation unit RE is set up to switch off the first switching element SE1 and the second switching element SE2 in the event of tripping, i.e., in the event of extreme overloads, such as a short circuit or idling, if necessary with a time delay.

Figure 2:
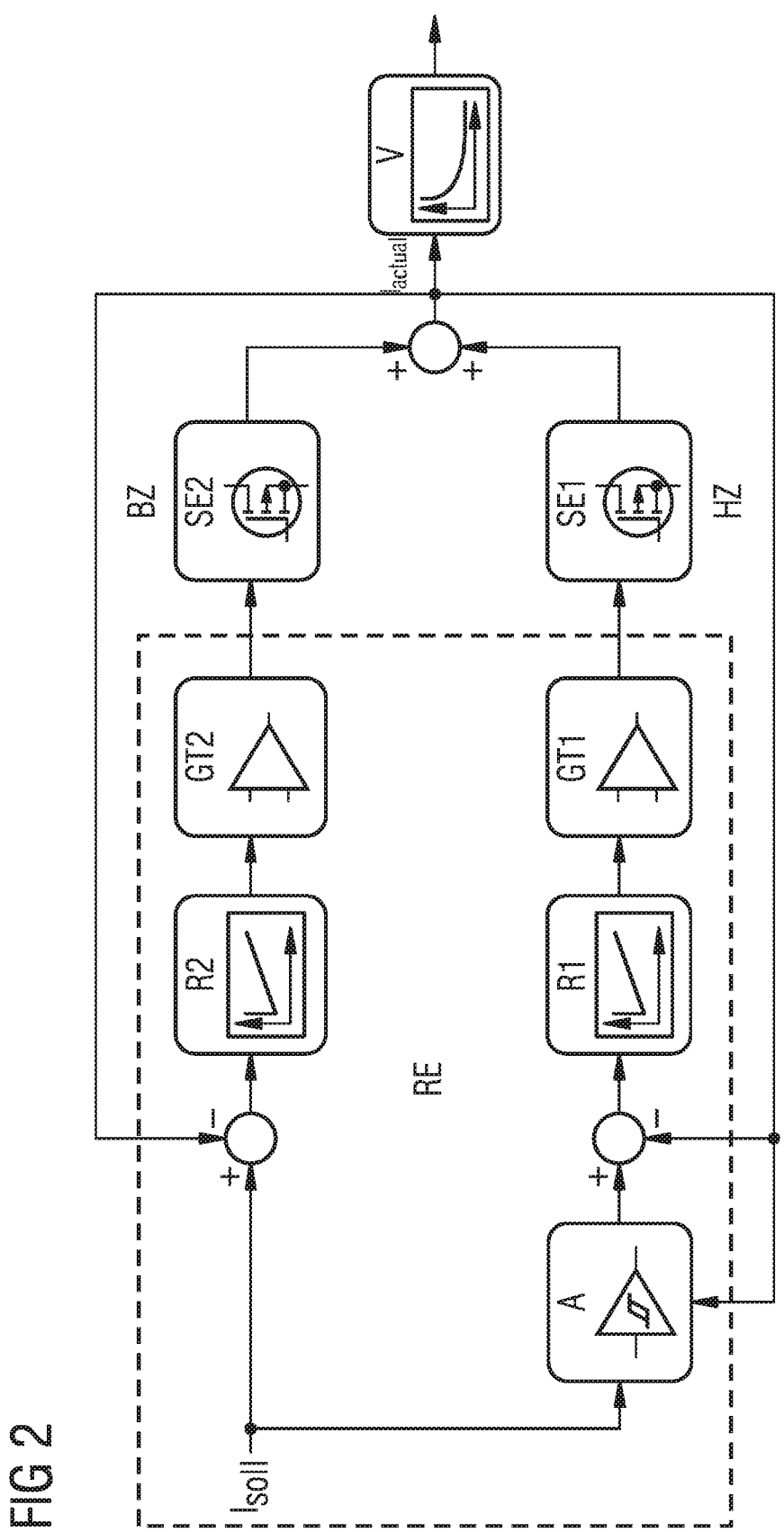
FIG. 2 shows an exemplary and diagrammatic view of a regulation concept for the at least two switching elements of the electronic fuse in accordance with the invention.

For this purpose, FIG. 2 shows a diagrammatic and exemplary view of regulation for the at least two switching elements SE1, SE2 of the electronic fuse in accordance with an embodiment of the invention, which can be combined to form the regulation unit RE. Both the main branch HZ and the auxiliary branch BZ each have a regulator R1, R2 with a separate current value comparison and a driver unit GT1, GT2 for actuating the respective switching element SE1, SE2. Here, the first switching element SE1 is actuated by a first regulator R1 and a first driver unit GT1, where the first regulator R1 becomes active, for example, as soon as the prevailing current value $I_{actual}$ falls below the predetermined threshold value $I_{target}$, such as when a capacitive load V is connected or if, for example, an overload occurs during normal operation, which exceeds the predetermined threshold value $I_{target}$. The first regulator R1 and the first driver unit GT1 can, for example, be formed as analog circuits or digital units (for example, microcontrollers, FPGA) or, if appropriate, as an analog-digital combination.

In addition, a switching unit A can be provided in the main branch HZ, which is connected upstream, for example, from the comparison of predetermined threshold value $I_{target}$ with the respective prevailing current value $I_{actual}$. The switching unit A can be formed, for example, as a microcontroller or as an analog comparator unit with hysteresis and can support switching of the first switching unit SE1.

In the auxiliary branch BZ, a second regulator R2 and a second driver unit GT2 are provided for actuating and regulating the second switching unit SE2. In the event of limitation, or when the prevailing current $I_{actual}$ is to be limited, the second regulator R2 always becomes active. That is, the second controller R2 regulates the second switching element SE2, for example, when starting up an at least partial capacitive load V or in the event of a load jump. The second regulator R2 and the second driver unit GT2 can also be formed, for example, as analog circuits or digital units (for example, microcontrollers, FPGA) or, if appropriate, as an analog-digital combination.

A voltage supply of the regulators R1, R2 or the regulation unit RE can, for example, be isolated or galvanically isolated from the supply voltage Uv of the power supply. This voltage supply or auxiliary supply is potentially above the supply voltage for the load V so that the switching elements SE1, SE2 can be actuated or switched correctly.

Furthermore, a digitally configured regulator unit (for example, microcontroller, FPGA) can be connected upstream of the regulation unit RE shown in FIG. 2, which performs regulation to the predetermined threshold value $I_{target}$ as precisely as possible. This digital regulator unit has, for example, its own current measurement, such as via a Hall-effect sensor or magnetoresistive sensor, and is used to compensate for temperature drift or offset deviations of the regulation unit RE.

Figure 3A:
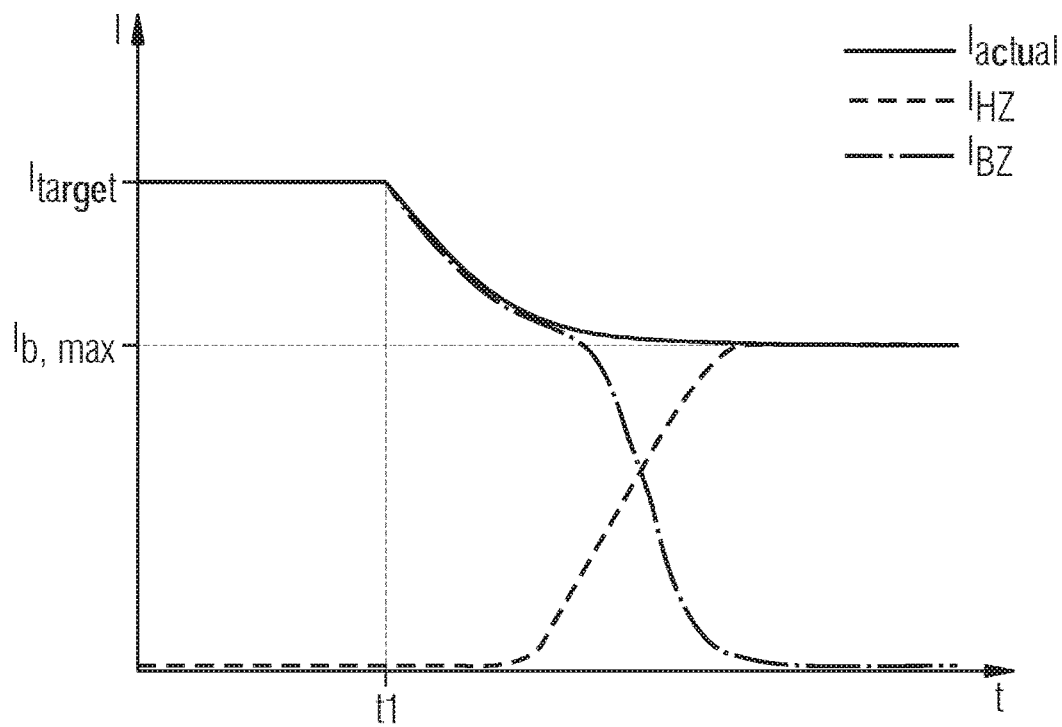
FIG. 3a shows an exemplary and diagrammatic view of a time profile of the prevailing current during a transition from an overload to normal operation of the electronic fuse in accordance with the invention.

FIG. 3a shows an exemplary and diagrammatic view of a graphical plot of a time profile of the prevailing current $I_{actual}$ in the event of a transition from an overload, such as when an at least partial capacitive load V is connected or in the event of a load jump to normal operation of the electronic fuse according to the invention. A time t is plotted on a horizontal axis and a current I is plotted on a vertical axis. The prevailing current value $I_{actual}$ in each case is shown as a solid line. The main branch current $I_{HZ}$ flowing in the main branch HZ is shown as a dashed line and the limiting current $I_{BZ}$ flowing in the auxiliary branch is shown as a dotted line.

If, for example, a load V with a capacitive component is connected to the power supply, in particular a DC voltage source, then on the basis of the capacitive component inrush currents occur, of which the predetermined threshold value $I_{target}$ would be exceeded. In this case, the auxiliary branch BZ is active, i.e., the first switching element SE1 is switched off and the second switching element SE2 is switched on, and the prevailing current $I_{actual}$ is kept constant at the predetermined threshold value $I_{target}$. That is, the entire current $I_{actual}$ flows through the auxiliary branch and the limiting current $I_{BZ}$ corresponds to the $I_{actual}$ or has the predetermined threshold value $I_{target}$. The second switching element SE2 assumes the resulting power loss. In the course of charging the capacitive load component, the prevailing current $I_{actual}$ drops in accordance with an e-function and approaches a maximum expected operating current $I_{b,max}$ for normal operation of the electronic fuse. If the prevailing current $I_{actual}$ begins to drop below the predetermined threshold value $I_{target}$, then the first switching element SE1 is switched on at a time t1 or becomes conductive when its threshold voltage is reached. The main branch current $I_{HZ}$ in the main branch HZ thus increases, i.e. the prevailing current $I_{actual}$ commutates from the auxiliary branch BZ into the main branch HZ. The limiting current $I_{BZ}$ decreases proportionally in the auxiliary branch until the current conduction in normal operation is almost completely taken over by the first switching element SE1 in the main branch HZ. Only a small current $I_{BZ}$ flows through the auxiliary branch BZ and the second switching element SE2, which remains switched on, can cool down.

Figure 3B:
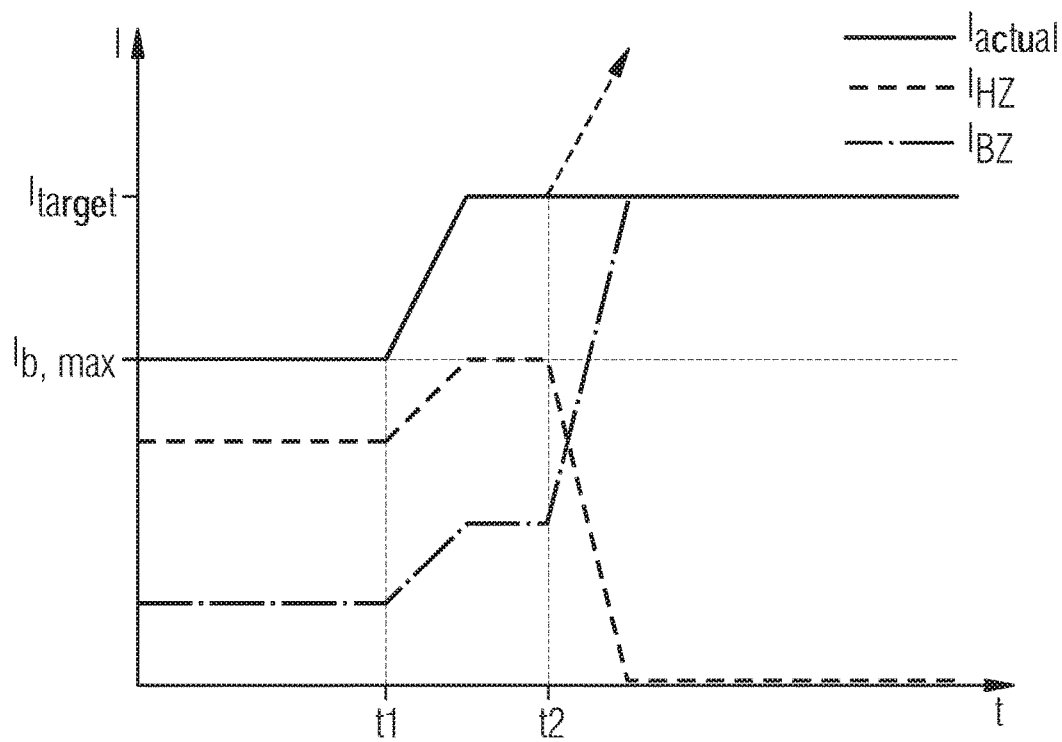
FIG. 3b shows an exemplary and diagrammatic view of a time profile of the prevailing current when an overload occurs during normal operation of the electronic fuse according to the invention.

FIG. 3b shows an exemplary and diagrammatic view of a graphical plot of a time profile of the prevailing current $I_{actual}$ when an overload occurs (for example, a load jump, a current peak) during normal operation of the electronic fuse according to the invention. The time t is again plotted on a horizontal axis and a current I is plotted on a vertical axis. The prevailing current value $I_{actual}$ in each case is again shown as a solid line. The main branch current $I_{HZ}$ flowing in the main branch HZ is shown as a dashed line and the limiting current $I_{BZ}$ flowing in the auxiliary branch is shown as a dotted line.

The electronic fuse is in normal operation, i.e., the at least two switching elements SE1, SE2 are both conductive or are operated in the ohmic or conductive region. The prevailing current $I_{actual}$ flowing in the fuse corresponds, for example, to the maximum expected operating current $I_{b,max}$ for normal operation, where the current $I_{actual}$ on the main branch HZ and the auxiliary branch BZ is divided up in the ratio of the amounts of the conductive resistances of the at least two switching elements SE1, SE2.

If, for example, an overload (such as current peak, short circuit or idle) occurs at a first time t1, then the prevailing current $I_{actual}$ in the electronic fuse and thus the currents $I_{HZ}$, $I_{BZ}$ in the main branch HZ and in the auxiliary branch BZ increase until the predetermined threshold value $I_{target}$ is reached or exceeded at a second time t2. The second regulator R2 and thus the second switching element SE2 in the auxiliary branch BZ become active and the output voltage UA is regulated back or the prevailing current $I_{actual}$ is limited to the predetermined threshold value $I_{target}$. Moreover, the first switching element SE1 is switched off in the main branch HZ, as a result of which the main branch current $I_{HZ}$ drops to zero. The limiting current $I_{BZ}$ in the auxiliary branch BZ increases to the predetermined threshold value and the auxiliary branch BZ takes over the resulting power loss (at least in the short term). The switching elements SE1, SE2 can only withstand the load arising from the power loss for a limited time without damage, and the second switching element SE2 is also switched off in the event of a lasting load, i.e., if the electronic fuse trips.

In FIGS. 1 and 2, the electronic fuse in accordance with the disclosed embodiments of the invention is illustrated by way of example with two switching elements SE1, SE2, e.g., a switching element SE1 in the main branch HZ and a switching element SE2 in the auxiliary branch BZ. However, in the case of the fuse in accordance with the disclosed embodiments of the invention, it is possible to provide further parallel auxiliary branches BZ with correspondingly configured second switching elements SE2 and/or further parallel main branches with correspondingly configured first switching elements SE1.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronic fuse for a power supply at least comprising:
    at least two switching elements, a first switching element of the at least two switching elements being arranged in a main branch via which a supply voltage is supplied to at least one output; and
    a regulation unit configured to switch a current of the first switching element when a predetermined threshold value is exceeded by a prevailing current value;
    wherein at least one second switching element, which is actuated by the regulation unit, is arranged in an auxiliary branch parallel to the first switching element and assumes a substantial proportion of a resulting power loss in the event of an overload, the first switching element and the at least second switching element being produced using different technology;
    wherein the at least second switching element is configured for linear operation; and
    wherein the at least two switching elements are configured such that a line resistance of the second switching element has at least twice the amount of a line resistance of the first switching element;
    wherein the measurement of the prevailing current value is galvanically isolated by a Hall-effect sensor or a magnetoresistive sensor.

2. The electronic fuse as claimed in claim 1, wherein the regulation unit is further configured such that the first switching element is switched on again after an overload in an event of the prevailing current value falling below the predetermined threshold value.

3. The electronic fuse as claimed in claim 2, wherein the regulation unit is configured such that the at least two switching elements are switched off in an event of tripping.

4. The electronic fuse as claimed in claim 1, wherein the regulation unit is configured such that the at least two switching elements are switched off in an event of tripping.

5. The electronic fuse as claimed in claim 1, wherein the at least second switching element has a higher voltage limit than the first switching element.

6. The electronic fuse as claimed in claim 1, wherein the first switching element comprises a field-effect transistor.

7. The electronic fuse as claimed in claim 1, wherein the at least second switching element comprises one of (i) a planar field-effect transistor, (ii) a trench field-effect transistor and (iii) as a bipolar transistor with insulated gate electrode (IGBT).

8. The electronic fuse as claimed in claim 1, further comprising:
    at least one current measuring resistor for a measuring a prevailing current value, said at least one current measuring resistor being arranged in series with a connection point of the at least two switching elements arranged in parallel.

9. The electronic fuse as claimed in claim 1, further comprising:

a current measuring resistor arranged in series for measuring the prevailing current value for each of the at least two switching elements.

10. The electronic fuse as claimed in claim 1, wherein the regulation unit comprises at least one first regulator for actuating the first switching element and a second regulator for actuating the at least second switching element.

11. The electronic fuse as claimed in claim 1, wherein the regulation unit is constructed from analog regulator units, as a cascade of analog and digital regulator units or of digital regulator units.

12. The electronic fuse as claimed in one claim 1, wherein a voltage supply of the regulation unit is isolated or galvanically isolated from the supply voltage of the power supply.

13. The electronic fuse as claimed in claim 1, further comprising:
    an activation unit for switching the first switching element, said activation unit comprising one of (i) a microcontroller and (ii) an analog comparator unit with hysteresis.

\* \* \* \* \*